United States Patent
Walker

(10) Patent No.: US 6,888,913 B2
(45) Date of Patent: May 3, 2005

(54) WIRELESS COMMUNICATION DEVICE WITH PHASE-LOCKED LOOP OSCILLATOR

(75) Inventor: Brett C. Walker, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 279 days.

(21) Appl. No.: 10/189,036

(22) Filed: Jul. 2, 2002

(65) Prior Publication Data

US 2004/0004506 A1 Jan. 8, 2004

(51) Int. Cl.$^7$ .............................................. H03K 21/00
(52) U.S. Cl. ........................................ 377/47; 377/48
(58) Field of Search ..................................... 377/47, 48

(56) References Cited

U.S. PATENT DOCUMENTS 6,369,623 B1 * 4/2002 Heinen ....................... 327/117
6,574,288 B1 * 6/2003 Welland et al. ............. 375/327

* cited by examiner

Primary Examiner—Margaret R. Wambach
(74) Attorney, Agent, or Firm—Philip Wadsworth; Charles D. Brown; Howard H. Seo

(57) ABSTRACT

A frequency generating circuit utilizes a quad modulus prescaler in which two control signals are used to select the prescaler modulus. The modulus control signals are generated by a multistage counter in which two independent counting stages are used to generate the first and second modulus control signals. The first modulus control signal is at a first logic level when the associated counter is at a non-zero value and is at a second logic level when the associated counter reaches zero. The second modulus control signal is generated by a second counter and has a first logic value when the second counter is in a non-zero state and a second logic value when the second counter reaches zero.

37 Claims, 7 Drawing Sheets

WIRELESS COMMUNICATION DEVICE WITH PHASE-LOCKED LOOP OSCILLATOR

BACKGROUND OF THE INVENTION

1. Field of the Invention

The present invention is related generally to wireless communication devices and, more particularly, to a wireless communication device having a programmable phase-locked loop oscillator.

2. Description of the Related Art

Wireless communication devices are commonly used today to supplement and, in some cases, to replace conventional telephones. As wireless technologies have improved, different standards have developed. Initially, most wireless devices were analog cellular telephones, sometimes referred to as advanced mobile phone system (AMPS), operating in the 800 MHz region of the spectrum. Newer devices, sometimes referred to as a personal communications system (PCS) device, are generally digital and operate in the 1900 MHz region of the spectrum. In addition, different communication standards have been embraced by governing entities in different parts of the world. For example, code division multiple access (CDMA) is widely used in North America while a global system for mobile (GSM) communication is widely used in Europe. Each of these differing technologies and different standards require operation of the wireless device at different frequencies and often have different frequency separations of adjacent channels in the spectrum.

As a result of the technical requirements, a typical wireless communication device uses frequency synthesis to generate the necessary radio frequencies for proper operation of the device. For example, as noted above, cellular telephones operate in the 800 MHz region while PCS devices operate in the 1900 MHz region of the spectrum. It is impractical to include separate radio frequency (RF) circuits to enable dual-mode operation of a wireless communication device. Instead, the wireless communication device includes a frequency synthesizer circuit to generate the necessary frequencies for proper operation of the device in the cellular mode or the PCS mode.

Frequency synthesizers often use a phase-locked loop (PLL) to generate desired frequencies. In a typical PLL circuit, a voltage-controlled oscillator (VCO), operates at frequencies of 1–2 GHz. Operation at these frequencies requires special integrated circuits to perform the necessary division for proper operation of the PLL. Technologies, such as emitter-coupled logic (ECL), may be used to divide the VCO frequency directly. However, ECL circuitry consumes a significant amount of electrical power. This is a problem in a battery operated wireless communication device. To avoid the high power consumption of ECL circuitry, a typical PLL implementation in a wireless communication device uses an ECL prescaler followed by a programmable CMOS counter.

With conventional architectures, there is a trade off between the minimum possible divide ($M_{min}$) and the divide value provided by the prescaler (P). It is desirable for the value P to be very large, which lowers the CMOS frequencies and thus the power consumption of the CMOS counters. Since CMOS counters are also very noisy it is important to minimize the frequency at which they operate to avoid coupling of spurious signals into adjacent RF circuits. It is also desirable to maintain a low $M_{min}$ for high flexibility in operation with various standards.

Therefore, it can be appreciated that there is a significant need for a circuit architecture that will allow flexibility in the frequency range while minimizing power consumption and spurious signals within the frequency generation circuit. The present invention provides this, and other advantages, as will be apparent from the following detailed description and accompanying figures.

BRIEF SUMMARY OF THE INVENTION

In an example embodiment, the present invention is embodied in an apparatus comprising a voltage controlled oscillator (VCO) having a control input and a prescaler having a clock input and a plurality of control inputs with a prescaler output clock having a modulus determined by the control inputs. The apparatus further comprises a plurality of programmable counters each having programmable counter inputs to receive data indicative of a respective count value and a clock input coupled to the prescaler output clock. A first counter of the plurality of programmable counters generates a preset signal to program the programmable counter inputs and the remaining programmable counters each control one of the control inputs for the prescaler with each control input having a first logic level while the respective counter is in a non-zero state and a second logic level while the respective counter is in a zero state.

In one embodiment, the apparatus further comprises a voltage controlled oscillator (VCO) having a control input and a VCO clock output whose frequency is dependent on a control signal coupled to the control input. The VCO clock output is coupled to the prescaler clock input. The VCO may be a portion of a phase-locked loop having a reference clock to generate a reference signal and a phase comparator having first and second inputs with the first input configured to receive the reference clock and the second input coupled to an output of the first counter. The output of the phase comparator is coupled to the VCO control input through a loop filter block.

In another example embodiment, the apparatus is designed for use in a wireless communication device having a radio frequency (RF) circuit portion. The apparatus comprises a mixer having an RF input and a local oscillator (LO) input. The plurality of programmable counters form a portion of a phase-locked loop with the VCO output clock being coupled to the LO input. In an alternative embodiment, the wireless communication device is a quadrature device and the mixer comprises first and second mixer portions each having an RF input and an LO input. The apparatus further comprises a phase splitter coupled to the VCO output clock to generate first and second quadrature LO signals for the first and second mixer portions, respectively.

In one embodiment, the first counter has a count length which is greater than a count length of any of the other ones of the plurality of programmable counters. In an exemplary embodiment, the first counter counts down from a preprogrammed count value to 1 and, upon reaching 1, the plurality of programmable counters being reprogrammed using the programmable counter inputs.

In one example embodiment, the prescaler has first and second control inputs and the plurality of programmable counters is implemented by first, second and third counters. The first control input has the first logic level while the second counter is in a non-zero state and the second control input has the first logic level while the third counter is in the non-zero state. The second and third counters each count down to 0, and upon reaching 0, stop until the first counter has reached a count value of 1.

In an exemplary embodiment, hardware logic circuits are coupled to the first, second and third counters to detect a count value of 1 in the first counter and count values of 0 in the second and third counters, respectively. In an exemplary embodiment, the hardware logic circuits may further generate the first and second control signals based on count values of the third and second counters, respectively.

DETAILED DESCRIPTION OF THE INVENTION

The present disclosure is directed to techniques for synthesizing the frequencies required for wireless communication devices. As will be described in greater detail below, the synthesizer circuit provides a flexible programmable counter that provides a broad range of frequencies required by a typical wireless communication device.

Figure 1:
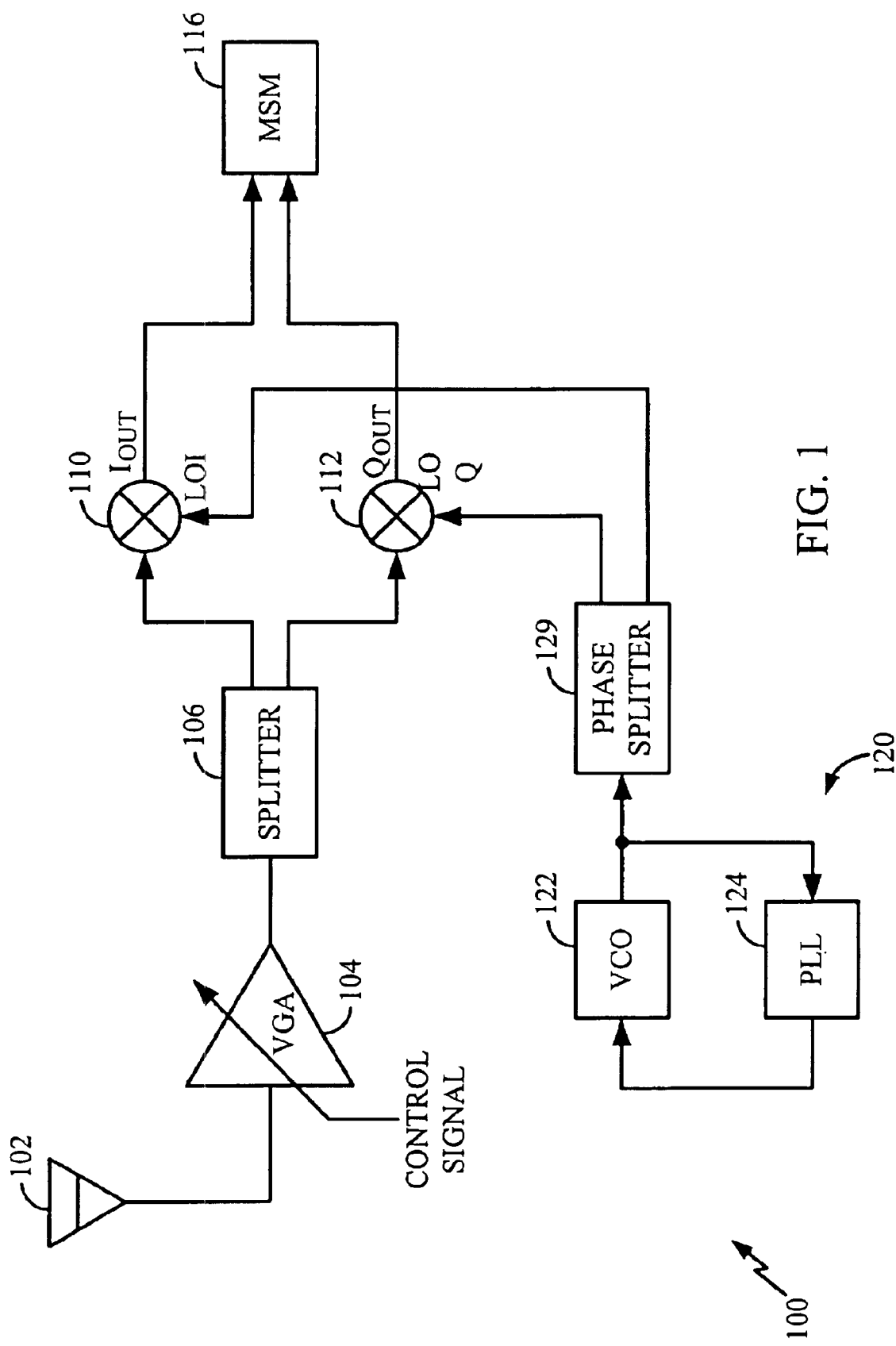
FIG. 1 is a functional block diagram of a wireless device implementing the present invention.

The present invention is illustrated, in an exemplary embodiment, in a system 100, illustrated in FIG. 1 as a portion of a wireless communication device. For the sake of clarity, FIG. 1 illustrates only the receiver portion of a wireless communication device and comprises an antenna 102 to detect RF energy. The antenna 102 is coupled to a variable gain amplifier (VGA) 104. The gain of the VGA 104 is set by a gain control signal, which may form part of an automatic gain control circuit. For the sake of brevity, details of implementation of the gain control signal are omitted since they form no part of the invention itself. However, those skilled in the art will appreciate that the gain control signal may be implemented in a known fashion. Also omitted from FIG. 1 are additional components, such as impedance matching circuitry and/or filter circuits.

The output of the VGA 104 is coupled to a splitter 106, which generates two identical copies of the output signal from the VGA. The outputs of the splitter 106 are coupled to respective inputs of mixers 110 and 112. The mixers 110 and 112 are typically identical in structure, but receive local oscillator (LO) signals that are 90 degrees out of phase with respect to each other. These quadrature oscillator signals are provided by a clock circuit 120, as will be described in greater detail below.

The output of the mixers 110 and 112 are coupled to a mobile station modem (MSM) 116 for demodulation in a known fashion. The mixers 110 and 112 may generate signals at an intermediate frequency (IF) and processed in a known fashion by the MSM 116. Alternatively, the mixers 110 and 112 may mix the signals to a frequency at or near baseband in a receiver architecture sometimes referred to as "direct-to-baseband." Details of the demodulation process are known to those skilled in the art and need not be described in greater detail herein.

Further details of the system 100 will focus on the clock circuit 120, which is implemented by a voltage-controlled (VCO) oscillator 122 and a phase-locked loop (PLL) 124. Although not part of the clock circuit 120, a phase splitter 126 is coupled to the output of the PLL circuit 124 to generate the two quadrature signals, designated as LOI and LOQ, respectively. The LOI and LOQ are LO signals coupled to the mixers 110 and 112, respectively.

The VCO 122 is a conventional VCO circuit generating a frequency in the 1–2 GHz range based on a control voltage input signal. The PLL 124 is illustrated in greater detail in FIG. 2 and comprises a divider chain 125, which will be described in greater detail below. The output of the divider chain 125 is coupled to one input of a phase comparator 126. A second input of the phase comparator 126 receives a signal from a reference clock 127. The phase comparator generates a control voltage based on the phase difference between the counter output from the divider chain 125 and the reference clock 127. In a typical embodiment, the reference clock 127 may operate at a frequency of 200 KHz. Those skilled in the art will recognize that the reference clock 127 may generate other frequencies. The present invention is not limited by the specific frequency of the reference clock 127.

The output of the phase comparator 126 is coupled to a loop filter 128, which is typically a low pass filter. The output of the loop filter 128 is coupled to a voltage control input of the VCO 122 (see FIG. 1). Thus, the phase lock loop clock circuit 120 provides a stable signal for the phase splitter 129 so that the LOI and LOQ signals may be generated for the mixers 110 and 112, respectively.

The PLL circuit 124 differs from other conventional circuits in that it provides a minimum of four different moduli for the divider chain 125. That is, the PLL circuit 124 comprises a quad modulus counter having four possible divide ratios. In an exemplary embodiment, the four divide ratios are designated herein as P, P+1, P+p, and P+p+1. In one implementation, the value p is selected to be the value of $\sqrt{P}$. In addition, the value of P may conveniently be chosen to be a power of 4.

Figure 2:
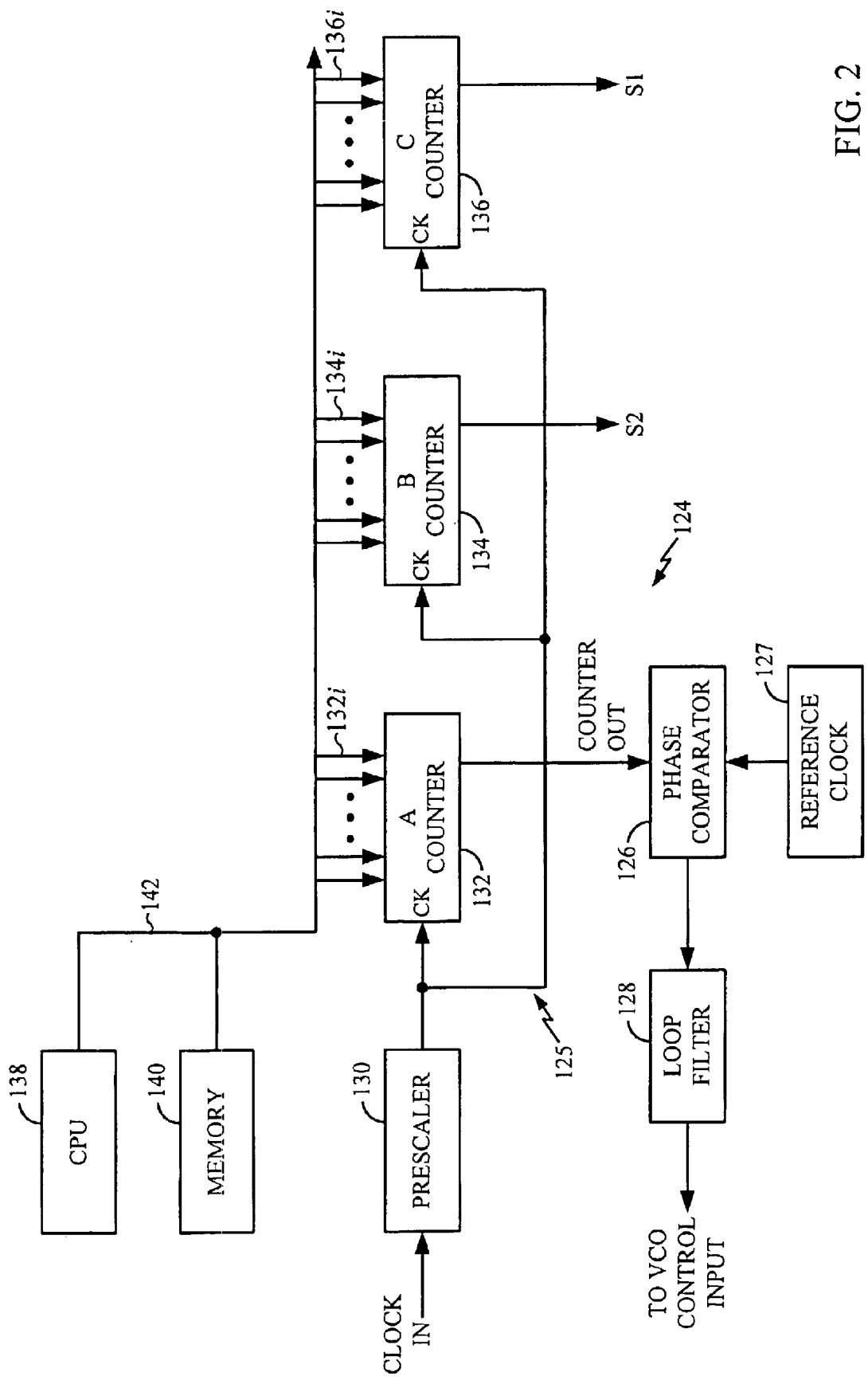
FIG. 2 is a functional block diagram illustrating details of the clock generation circuit of the present invention.

FIG. 2 is a functional block diagram illustrating an example implementation of the PLL circuit 124. The divider chain 125 comprises a prescaler 130 and a series of three counter circuits 132–136, designated herein as an A Counter, B Counter, and C Counter, respectively. In an exemplary embodiment, the prescaler 130 is implemented with high-speed logic circuits, such as emitter-coupled logic (ECL), while the counters 132–136 are implemented by CMOS logic circuits. Those skilled in the art will recognize that the prescaler 130 and counters 132–136 may be implemented using other logic circuit technologies. Accordingly, the present invention is not limited by the specific technology used to implement the prescaler 130 and the counters 132–136.

The counters 132–136 are programmable counters with programming inputs 132i–136i, respectively. In an exemplary embodiment, the counters 132–136 are loaded with a predetermined count number and count down to zero or one. However, those skilled in the art will recognize that other possibilities, such as loading a complementary number and counting up to zero may also be used by the counters 132–136.

The counter inputs 132i–136i are programmed by a central processing unit (CPU) 138 based on instructions and data stored a memory 140. Those skilled in the art will appreciate that the term "CPU" is intended to encompass any processing device, alone or in combination with other devices, that is capable of operating the system 100. This includes microprocessors, embedded controllers, application specific integrated circuits (ASICs), digital signal processors (DSPs), state machines, dedicated discrete hardware, and the like. The present invention is not limited by the specific hardware component or components selected to implement the CPU 138.

The memory 140 may include both read-only memory (ROM) and random access memory (RAM). A portion of the memory 140 may also include non-volatile random access memory. The memory 140 provides instructions and data to the CPU 138. The CPU 138 and memory 140 are coupled to the counters 132–136 via a data bus 142. The data bus 142 may include a power bus, control bus and status signal bus in addition to a data bus. For the sake of clarity, the various buses are illustrated in FIG. 2 as the bus system 142.

The operation of the counters 132–136 may now be described in greater detail. The total length (in bits) of the counters 132–136 determine the length of the overall counter. The A Counter 132 is longer in bit length than the B and C Counters 134–136 and can be any length (in bits) to extend the length (in bits) of the overall counter.

The B Counter 134 and C Counter 136 are used to control the prescaler moduli with the length of each counter (in bits) being determined by the value $\log_2$ (p). The PLL 124 generates two modulus control signals, designated herein as control signals S1 and S2. While the B Counter 134 is counting down, but is not in a 0 state, the value of S2 is set to a logic high. Similarly, while the C Counter 136 is counting down, but is not in a 0 state, the value of S1 is set to a logic high. As will be described in greater detail, the control signals S1 and S2 are modulus control signals that will select the divisor ratio of the prescaler 130.

For the sake of clarity, the control signals S1 and S2 are illustrated as emanating from the C Counter 136 and the B Counter 134, respectively. Subsequent figures in the present disclosure illustrate hardware circuitry for detecting a zero state in the B counter 134 and the C counter 136 to thereby generate the control signals S1 and S2. However, those skilled in the art will appreciate that other techniques for generating the control signals S1 and S2 may be readily implemented by the system 100. For example, the CPU 138 could load the contents of the B Counter 134 and the C Counter 136 and use software commands to determine whether the counters are in the 0 state or in a non-zero state. In this embodiment, the CPU 138 may generate the control signals S1 and S2 based on the status of the C Counter 136 and the B Counter 134, respectively.

The CLOCK-IN signal, which is provided as an input to the prescaler 130, is generated by the VCO 122 (see FIG. 1). A counter cycle begins by pre-programming the counters 132–136 via the programming in puts 132i–136i, respectively. Each counter begins to count down at each clock cycle and stops after reaching zero. For each counting cycle, the prescaler 130 divides by:

P+S2*p+S1, where S2 and S1 are state variables based on the count value of the B Counter 134 and the C Counter 136, respectively. The state variables have a one logic value (e.g., a logic 1) prior to the respective counter reaching zero and a second logic value (i.e., a logic 0) thereafter.

The complete count cycle repeats after the A Counter 132 counts down to a value of 1. For the sake of convenience in the circuit design, the A counter 132 counts down to a value of one because one prescaler cycle is used to preset all the counters. However, the A counter 132 could be designed to count to zero and include additional preset circuitry. Such circuit modification is well within the skill of the practitioner and need not be described in greater detail herein. The total counter value, therefore, is given by the following:

A*P+B*p+C which results in a value N=[A:B:C]. The output of the A Counter 132 is coupled to one input of the phase comparator 126 (see FIG. 2). For the counter to operate correctly A must be larger than either B or C. It follows from the above that a value $A_{min}=B_{max}=C_{max}=p$. Since the value p was selected to equal the $\sqrt{P}$, the value of $N_{min}=p*P=P^{3/2}$. In contrast, $N_{min}$ in a typical dual modulus is prescaler, is limited to a value of $P^2$, which severely limits the divide value provided by the prescaler.

Figure 3:
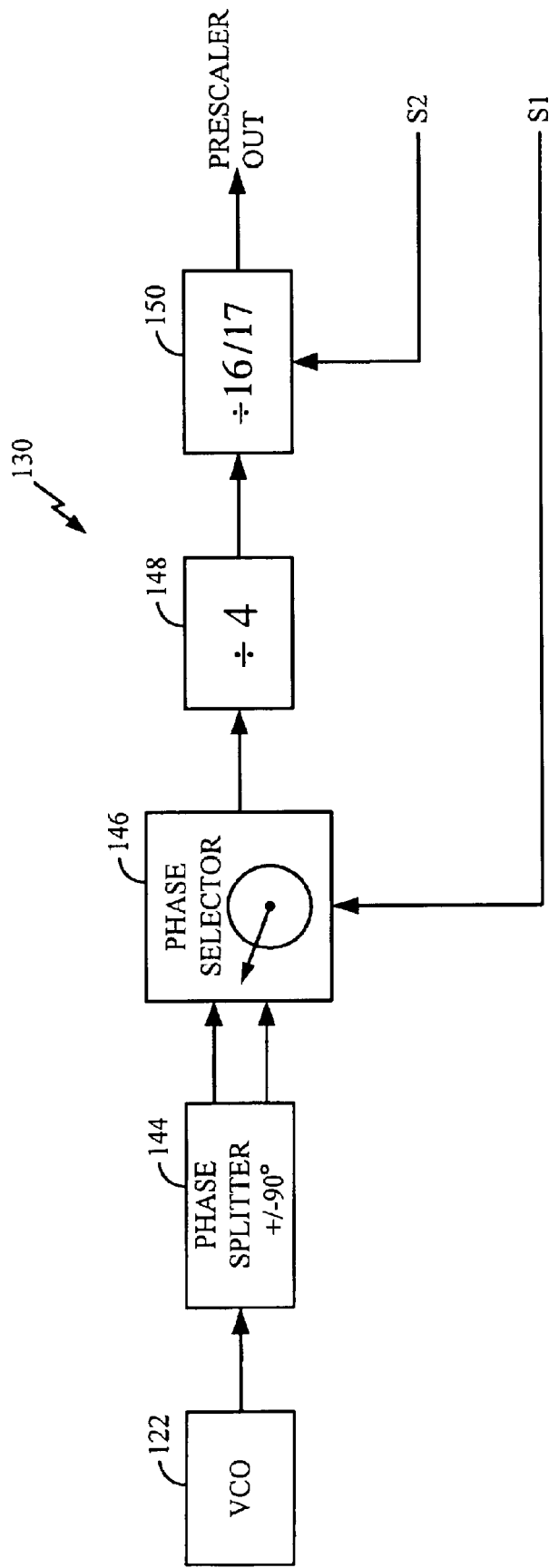
FIG. 3 is a functional block diagram illustrating a prescaler of the present invention.

FIG. 3 has a functional block diagram of the prescaler 130. The architecture illustrated in FIG. 3 takes advantage of the fact that quadrature signals are available at the LO frequency to achieve excellent performance for low current while also permitting division by non-integer divide ratios. The use of the quadrature signals can provide a ¼ divide capability. The prescaler 130 uses a phase splitter 144 to generate quadrature signals. The quadrature outputs are provided to a phase selector 146 whose operation will be described in greater detail below. The output of the phase selector 146 is coupled to a divide-by-4 divider circuit 148 which, in turn, is coupled to a divide-by-16/17 divider circuit 150.

The high-frequency operation of the prescaler 130 is achieved using the phase selection architecture, as is known in the art. Typically this architecture uses a pre-divide-by-4 divider circuit in front of the phase selector 146 to provide accurate quadrature signals and to lower the frequency of the input signal with the pre-divide-by-4 divider circuit being implemented only by divide-by-2 toggle flip-flops.

In the architecture illustrated in FIG. 3, accurate quadrature signals generated by the phase splitter 144, a pre-divide-by-4 divider circuit is not required by the circuit of FIG. 3. Thus, the quadrature signals are already provided directly to the phase selector 146. If the control signal SI is high, the phase selector 146 will move to the next phase each time the output of the prescaler 130 goes high. When this occurs, the counter essentially drops a quarter cycle making the total divide ratio increase by one-quarter.

The effective counter divide ratios are in Table 1 below.

| S1 | S2 | Prescaler Divide Ratio |
|---|---|---|
| 0 | 0 | 64 |
| 1 | 0 | 64.25 |
| 0 | 1 | 68 |
| 1 | 1 | 68.25 |

The divide-by-4 circuit 148 provides a fixed divisor. The divide-by-16/17 divider circuit 150 is a modulus that is controlled by the control signal S2, as noted above. When the control signal S2 is a logic of 0, the counter 150 divides by 16. When the control signal S2 is a logic 1, the counter 150 divides by 17. Thus, the prescaler 130 provides a divide-by-64 (i.e., 4×16) when the control signal S2 is at a logic 0 and provides a divide-by-68 (i.e., 4×17) when the control signal S2 is a logic 1. In addition, the prescaler 130 provides an additional divide-by-¼ (i.e., ÷64.25 or 68.25) when the control signal S1 is a logic 1.

Figure 4:
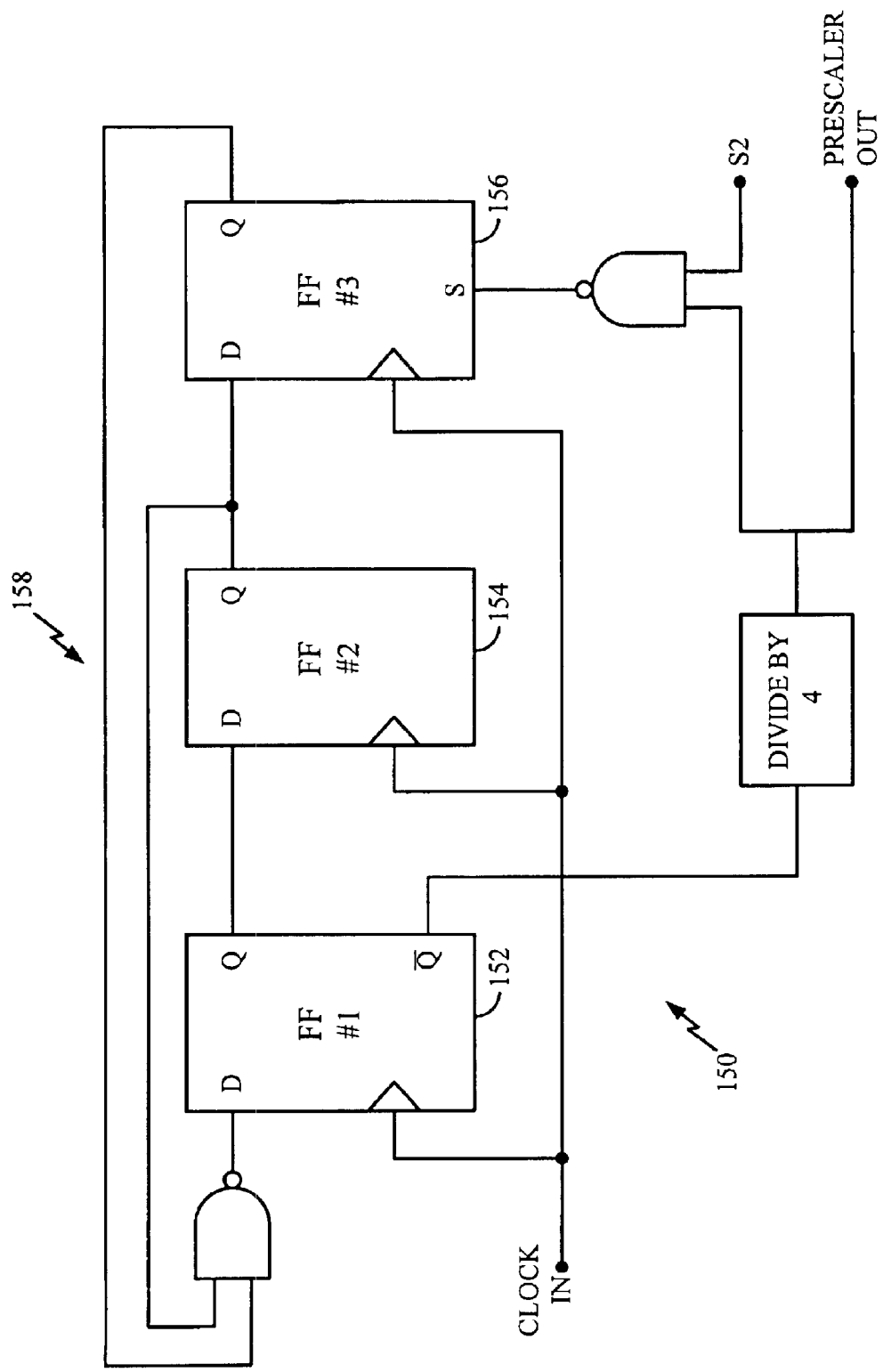
FIG. 4 is a logic circuit illustrating an example implementation of a divider chain used in the prescaler of the present invention.

An example implementation of the divide-by-16/17 divider circuit 150 is illustrated in FIG. 4. The divider circuit 150 consists of series connected D Flip-Flops 152–156, which form a first state machine 158. The first state machine 158 forms a divide-by-4/5 counter. Whether the first state machine 158 divides by 4 or 5 is determined by a second state machine 160, which is formed by a divide-by-4 counter 166 and the modulus input (i.e., the control signal S2) from the B Counter 134 (see FIG. 2). The first state machine 158 divides by 4 for a portion of the clock cycles and divides by 5 for a portion of the clock cycles. As a result, the combination of the first state machine 158 and the second state machine 160 is a divide by 16/17 circuit. The CLOCK IN signal is provided by the VCO 122. The PRESCALER OUT signal is the output of the prescaler 130.

Returning momentarily to FIG. 2, the A Counter 132, B Counter 134, C Counter 136, taken in combination with the prescaler 130, form an N bit counter. An implementation of the A counter 132 is illustrated in the logic diagram of FIG. 5 where a clock input (i.e., the PRESCALER OUTPUT) is coupled to a sequentially connected divider chain 170, which forms an M stage counter. In an exemplary embodiment, M=12. Those skilled in the art will recognize that other counter bit lengths may also be used. The M stage counter is preset with a predetermined value via the programming input 132*i* to provide the desired LO frequency. The A Counter 132 counts down from the preset number until it reaches a value of 1. A logic circuit 172 detects a count of 1 in the A Counter 132 and triggers a reset process in which the predetermined value is reprogrammed into the A Counter 132 via the programming inputs 132*i*.

As previously discussed, the predetermined value programmed into the counters 132–136 may initially be determined by the CPU 138 (see FIG. 2). In an exemplary embodiment, the CPU 138 receives instructions from a base station (not shown) indicating the operational frequency of the wireless communication device. Based on the frequency generated by the VCO 122 (see FIG. 1), the CPU 138 may readily determine the divisor count required to generate the necessary LO frequency for operation at the designated operational frequency of the wireless communication device. As noted above, the output of the VCO 122 directly generates the LO frequency, which is phase locked to the reference clock 127 (see FIG. 2). The counters 132–136 may be programmed accordingly by data provided by the CPU 138 via the bus system 142 in the programmable inputs 132*i*–136*i*.

Figure 6:
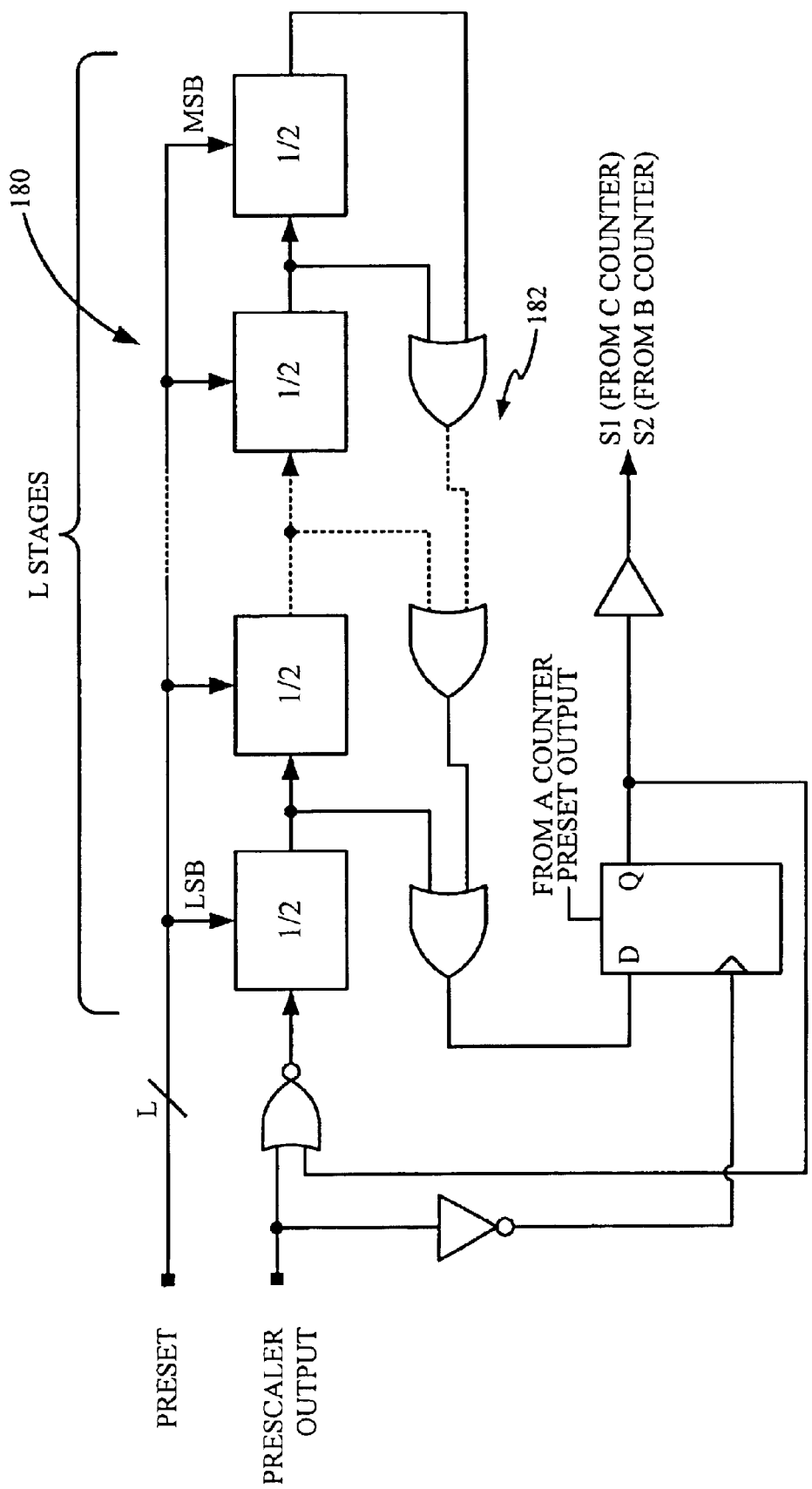
FIG. 6 is a logic diagram illustrating an example of additional counters used by the clock generation circuit of the present invention.

An example implementation of the B counter 134 and C counter 136 is illustrated in the logic diagram of FIG. 6. The B counter 134 and the C counter 136 may be implemented by identical logic circuits. For the sake of clarity, only one counter is illustrated in FIG. 6. The B and C counters 134–136 are each implemented by a sequentially connected divider chain 180, which forms an L stage counter. The clock input (i.e., the PRESCALER OUTPUT) is coupled to the first sequential stage (i.e., the least significant bit) of the divider chain 180. In an exemplary embodiment, L=4 for each of the counters (i.e., the B counter 134 and the C counter 136). Although it is convenient to have the bit length of the B Counter 134 be identical to the bit length of the C Counter 136, this is not required for satisfactory operation of the system 100. That is, the B and C Counters 134 and 136 may have different respective bit lengths. Each of the L stages of the B counter 134 and the C counter 136 are preset with predetermined values via the programming inputs 134*i* and 136*i*, respectively, depending on the desired LO frequency.

The outputs of each of the L stages are coupled to a logic circuit 182 to detect when the B Counter 134 and C Counter 136 have reached zero. As previously discussed, the control signals S1 and S2 are generated by the C Counter 136 and the B Counter 134, respectively. So long as the C Counter 136 is at a non-zero value, the control signal S1 is a logic 1. When the C Counter 136 reaches zero, the logic circuit 182 causes the control signal S1 to switch to a logic 0. Similarly, so long as the B Counter 134 is at a non-zero value, the control signal S2 is a logic 1. When the B Counter 134 reaches zero, the logic circuit 182 causes the control signal S2 to switch to a logic 0. The logic circuit 182 also holds the B Counter 134 and the C Counter 136 in the zero state until the A Counter 132 is reset.

Figure 7:
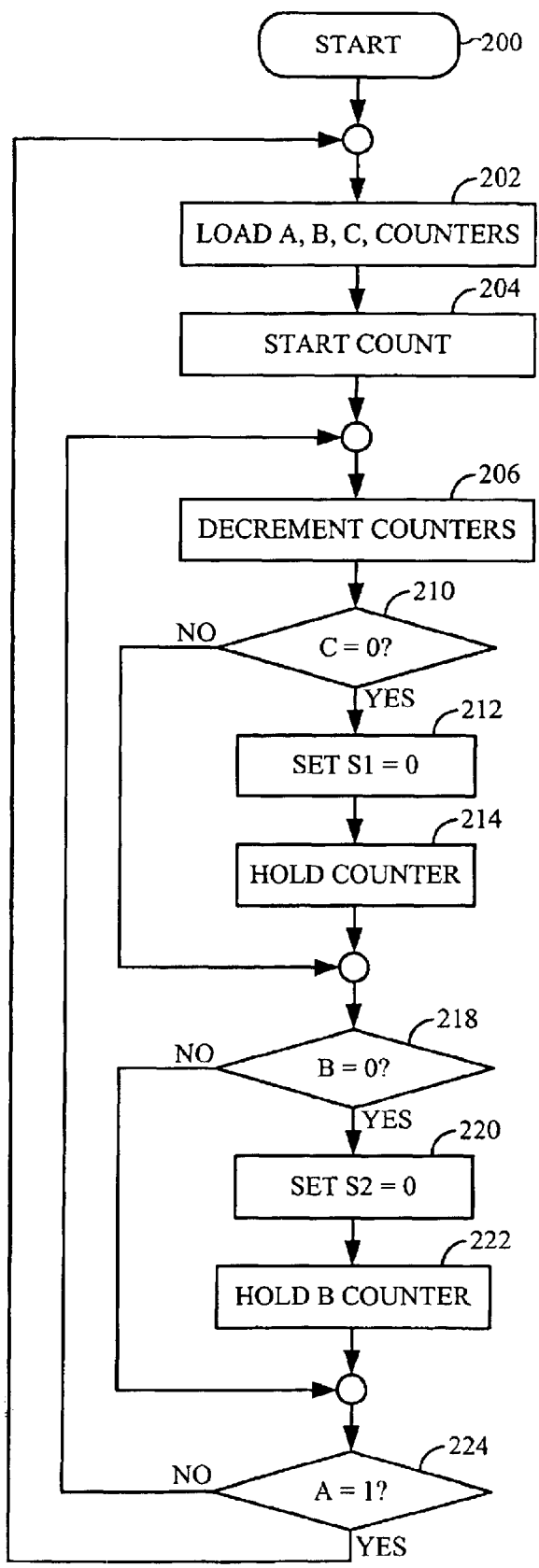
FIG. 7 is a flow chart illustrating the operation of the present invention.

Taken together, the A counter 132, B counter 134, and C counter 136 provide a 20-bit programmable counter. The operation of the counters is illustrated in the flow chart of FIG. 7 where, at a start 200 the wireless communication device is under power and is assigned a specific operational frequency by a base station (not shown). The assignment of operational frequencies depends on the particular range of frequencies assigned for wireless communication and upon the particular standard implemented by the wireless system. For example, analog cellular telephones (i.e., AMPS) operate in the 800 MHz region while personal communications system (PCS) devices operate in the 1900 MHz region. Communications standards, such as CDMA, may further specify channel frequencies and channel spacings for a particular frequency range (e.g., CDMA PCS devices operating in the 1900 MHz region) while other standards, such as GSM may specify different channel assignments and channel spacing. The specific operational frequency is not critical to a proper understanding of the present invention. However, the system 100 provides a broad range of devisors and thus great flexibility in frequency generation.

Returning again to FIG. 7, at step 200, the predetermined counts are loaded into the A Counter 132, the B Counter 134 and the C Counter 136 via the programming inputs 132*i*–136*i*, respectively. In step 204, the counting begins and, in step 206, the A–C Counters 132–136 are decremented.

In decision 210, the system 100 determines whether the count value for the C Counter 136 equals zero. If the count value does equal zero, the result of decision 210 is YES. In that event, the value for the control signal S1 is set a logic 0 in step 212. In step 214, the C Counter 136 is placed in hold so that the counter does not continue to count. As noted above, the sample implementation of the C Counter 136 is illustrated in the logic diagram of FIG. 6. The logic circuit 182 provides a hardware implementation to detect the zero state of the C Counter 136 and to generate the control signal S1. However, in alternative embodiments, the status of the C Counter 136 may be determined by the CPU 138 (see FIG. 2) and the control signal S1 generated by the CPU or other peripheral device under the control of the CPU.

If the C Counter 136 is not in the zero state, the result of decision 210 is NO. In that event, or following the execution of step 214, the system 100 moves to decision 218.

In decision 218, the system 100 determines whether the count value for the B Counter 134 equals zero. If the count value does equal zero, the result of decision 210 is YES. In that event, the value for the control signal S2 is set a logic 0 in step 220. In step 222, the B Counter 134 is placed in hold so that the counter does not continue to count. As noted above, the sample implementation of the B Counter 134 is illustrated in the logic diagram of FIG. 6. The logic circuit 182 provides a hardware implementation to detect the zero state of the B Counter 134 and to generate the control signal S2. However, in alternative embodiments, the status of the B Counter 134 may be determined by the CPU 138 (see FIG. 2) and the control signal S2 generated by the CPU or other peripheral device under the control of the CPU.

If the B Counter 134 is not in the zero state, the result of decision 218 is NO. In that event, or following the execution of step 220, the system 100 moves to decision 222.

The system 100 moves to step 224. In step 224, the system 100 determines whether the A Counter 132 equals 1. If the A Counter 132 has not reached a value of 1, the result of decision 224 is NO and the system returns to step 206 to continue decrementing the counters. As previously noted, the A Counter 132 must be larger in bit length than either the B Counter 134 or the C Counter 136. Thus, B Counter 134 and the C Counter 136 will always reach a zero state prior to the A Counter 132. When the A Counter 132 does reach a value of 1, the result of decision 224 is YES. In that event, the system 100 returns to step 202 to reload the A–C Counters 132–136 and repeat the process. Thus, the system 100 continues to generate the desired frequencies for use by the mixers 110 and 112 (see FIG. 1). It should be noted that the CPU 138 (see FIG. 2) may alter the programming values in the A–C Counters 132–136 upon receipt of instructions from the base station (not shown).

As can be readily calculated, the divide ratio of the prescaler 130 is equal to:

$$64 + S2*4 + S1*\tfrac{1}{4}.$$

Figure 5:
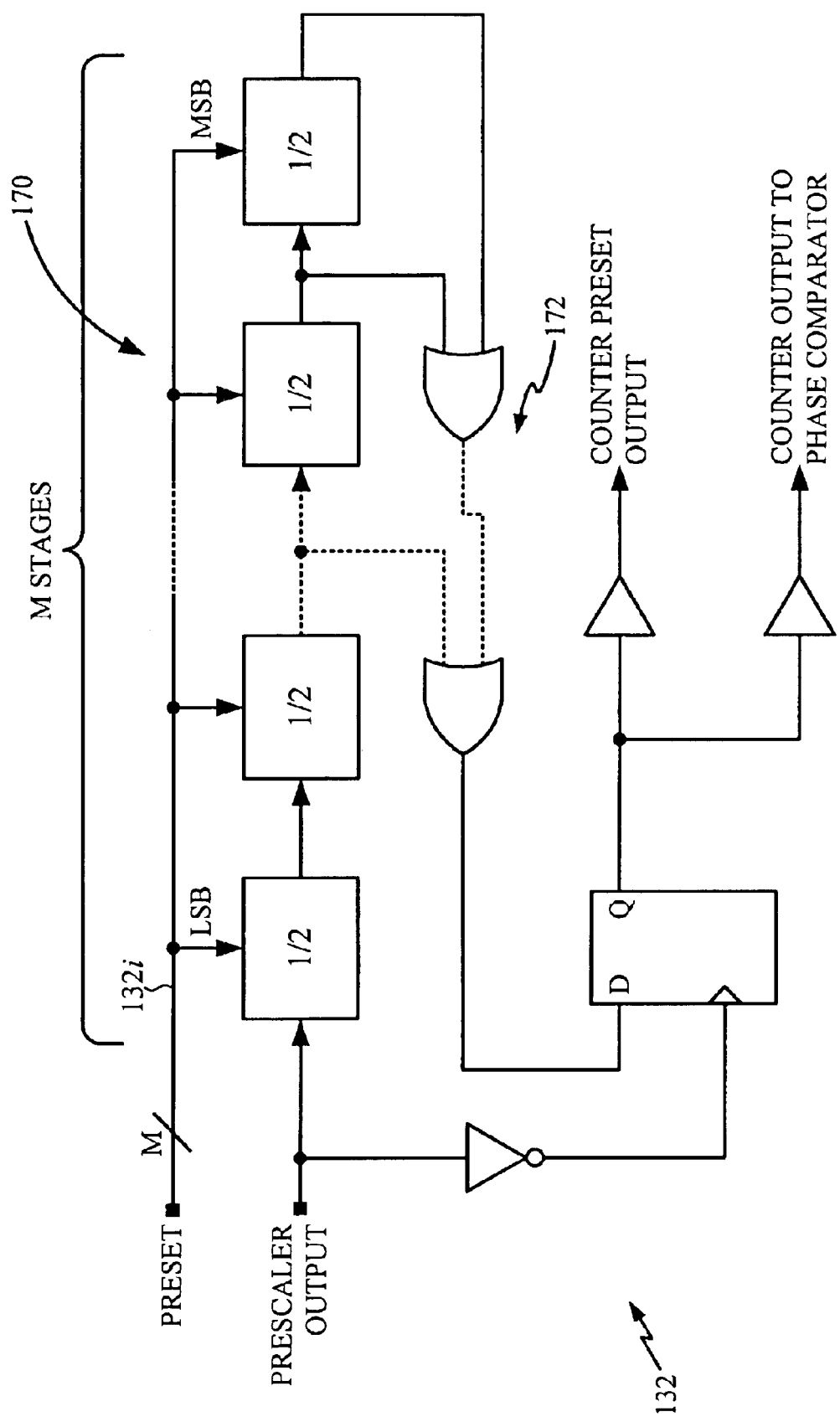
FIG. 5 is a logic diagram illustrating one example of a counter circuit of the present invention.

Based on the logic circuit of FIGS. 4–6, it can be easily shown that:

$$N = A*64 + B*4 + C*1/4$$

$$= \frac{A*2^8 + B*2^4 + C*2^0}{4}$$

As noted above, an exemplary embodiment of the system 100 implements a 20-bit counter using the A–C Counters 132–136. In the example listed above, the N stage counter setting (N<19:0>) is divided as follows:

$$A = N<19:8>, \ B = N<7:4>, \ C = N<3:0>$$

where the A Counter 132 is 12 bits in length and the B Counter 134 and C Counter 136 are each 4 bits in length. The maximum divide ratio is limited only by the size of the counter. For example, additional bits could be added to the A–C Counters 132–136. The minimum divide ratio is limited by the constraint that the A Counter 132 must be bigger than both the B Counter 134 and the C Counter 136. In the example illustrated above, where the B Counter 134 and C Counter 136 are 4 bits, their maximum value is 15 and, therefore, the minimum value of the A Counter 132 is 16. Based on these limitations, the minimum and maximum divides are listed in table 2 below.

TABLE 2

| Prescaler | $A_{min}$ | $A_{max}$ | $B_{min}$ | $B_{max}$ | $C_{min}$ | $C_{max}$ | $N_{min}$ | $N_{max}$ |
|---|---|---|---|---|---|---|---|---|
| 64 | 16 | 4095 | 0 | 15 | 0 | 15 | 1024 | 262143.75 |

The system 100 thus provides great flexibility in implementation and permits use in various frequency ranges and with differing communication standards. The system 100 has been described above in a number of varying implementations and architectures. It is to be understood that even though various embodiments and advantages have been set forth in the foregoing description, the above disclosure is illustrative only, and changes may be made in detail, yet remain within the broad principles of the invention. Therefore, the present invention is to be limited only by the appended claims.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A programmable high speed counter apparatus, comprising:

a prescaler having a prescaler clock input, first and second control inputs, and a prescaler output clock having a quad-modulus counter with a divide ratio determined by the first and second control inputs, an integer portion of the divide ratio based in part on the first control input and a fractional portion of the divide ratio based in art on the second control input; and first, second and third programmable counters each having programmable counter inputs to receive data indicative of a respective count value and a clock input coupled to the prescaler output clock, the first control input having a first logic level while the second counter is in a non-zero stale and the second control input having the first logic level while the third counter is in a non-zero state.

2. The apparatus of claim 1 wherein the first counter has a count length greater than a count length of the second counter and greater than a count length of the third counter.

3. The apparatus of claim 1 wherein the second counter counts down from a preprogrammed count value to zero and stops upon reaching zero, the first control input changing from the first logic level to a second logic level when the second counter reaches zero.

4. The apparatus of claim 3, further comprising a hardware logic circuit having inputs coupled to the second counter and a logic circuit output to generate a first control signal coupled to the first control input, wherein the logic circuit output is at the first logic level when the second counter is in the non-zero state and changes from the first logic level to the second logic level when the second counter reaches zero.

5. The apparatus of claim 1 wherein the third counter counts down from a preprogrammed count value to zero and stops upon reaching zero, the second control input changing from the first logic level to a second logic level when the third counter reaches zero.

6. The apparatus of claim 5, further comprising a hardware logic circuit having inputs coupled to the third counter and a logic circuit output to generate a second control signal coupled to the second control input, wherein the logic circuit output is at the first logic level when the third counter is in the non-zero state and changes from the first logic level to the second logic level when the third counter reaches zero.

7. The apparatus of claim 1 wherein the first counter counts down from a preprogrammed count value to one and, upon reaching one, the first, second and third counter being reprogrammed using the programmable counter inputs.

8. The apparatus of claim 7, further comprising a hardware logic circuit having inputs coupled to the first counter and a logic circuit output to generate a preset control signal wherein the logic circuit output is at the first logic level when the first counter has a count value greater than one and changes from the first logic level to a second logic level when the first counter reaches one.

9. The apparatus of claim 1, further comprising a voltage controlled oscillator (VCO) having a control input and a VCO clock output whose frequency is dependent on a control signal coupled to the control input, the VCO clock output being coupled to the prescaler clock input.

10. The apparatus of claim 9, further comprising a reference clock generating a reference signal and a phase comparator having first and second inputs and an output, the first input configured to receive the reference clock and the second input coupled to an output of the first counter, the output of the phase comparator being coupled to the VCO control input.

11. The apparatus of claim 9 for use in a wireless communication device having a radio frequency (RF) circuit portion, the apparatus further comprising a mixer having an RF input and a local oscillator (LO) input, the first, second and third programmable counters forming a portion of a phase-locked loop with the VCO clock output being coupled to the LO input.

12. The apparatus of claim 11 wherein the wireless communication device is a quadrature device and the mixer comprises first and second mixer portions each having an RF input and an LO input, the apparatus further comprising a phase splitter coupled to the VCO clock output to generate first and second quadrature LO signals for the first and second mixer portions, respectively.

13. The apparatus of claim 1, wherein the prescaler comprises a phase selector having an input coupled to the prescaler clock input and configured to provide an output phase in response to the second control input.

14. The apparatus of claim 1, wherein the prescaler comprises:
a phase splitter having art input coupled to the prescaler clock input and a plurality of phase outputs; and
a phase selector having a plurality of inputs and an output, each input coupled to one of the plurality of outputs of the phase splitter, and configured to provide an output phase in response to the second control input.

15. A programmable high speed counter apparatus, comprising:
a prescaler having a prescaler clock input, a plurality of control inputs, and a prescaler output clock having a modulus determined by the plurality of control inputs, the modulus capable of fractional values; and
a plurality of programmable counters each having programmable counter inputs to receive data indicative of a respective count value and a clock input coupled to the prescaler output clock, a first counter of the plurality of programmable counters generating a preset signal to program the programmable counter inputs and the remaining ones of the programmable counters each controlling one of the control inputs with each control input having a first logic level while the respective counter is in a non-zero state and a second logic level while the respective counter is in a zero state.

16. The apparatus of claim 15, further comprising a voltage controlled oscillator (VCO) having a control input end a VCO clock output whose frequency is dependent on a control signal coupled to the control input, the VCO clock output being coupled to the prescaler clock input.

17. The apparatus of claim 16, further comprising a reference clock generating a reference signal and a phase comparator having first and second inputs and an output, the first input configured to receive the reference clock and the second input coupled to an output of the first counter, the output of the phase comparator being coupled to the VCO control input.

18. The apparatus of claim 16 for use in a wireless communication device having a radio frequency (RF) circuit portion, the apparatus further comprising a mixer having an RF input and a local oscillator (LO) input, the plurality of programmable counters forming a portion of a phase-locked loop with the VCO clock output being coupled to the LO input.

19. The apparatus of claim 18 wherein the wireless communication device is a quadrature device and the mixer comprises first and second mixer portions each having an RF input and an LO input, the apparatus further comprising a phase splitter coupled to the VCO clock output to generate first and second quadrature LO signals for the first and second mixer portions, respectively.

20. The apparatus of claim 15 wherein the first counter has a count length greater than a count length of any of the other ones of the plurality of programmable counters.

21. The apparatus of claim 15 wherein the first counter counts down from a preprogrammed count value to one and, upon reaching one, the plurality of programmable counters being reprogrammed using the programmable counter inputs.

22. A programmable high speed frequency generator apparatus, comprising:
first counter means having an input and an output whose count modulus, configurable from a plurality of integer and fractional values, is determined by a plurality of control inputs; and
second counter means having a plurality of counter stages each having programmable counter inputs to receive data indicative of a respective count value and a clock input coupled to the output of the first counter means, a first counter of the plurality of counter stages generating a preset signal to program the programmable counter inputs, the remaining ones of the plurality of counter stages each controlling one of the control inputs for the first counter means.

23. The apparatus of claim 22 wherein the first and second counter means form a portion of a phase-locked loop, the apparatus further comprising:
oscillator means for generating an output whose frequency is dependent on a control signal;
reference means for generating a reference signal; and
phase comparison means for comparing the phase of the reference signal and an output of the first counter stage, the phase comparison means generating the oscillator means control signal.

24. The apparatus of claim 23 for use in a wireless communication device having a radio frequency (RF) circuit portion, the apparatus further comprising means for mixing an RF input and a local oscillator (LO) input wherein the oscillator means output is coupled to the LO input.

25. The apparatus of claim 24 wherein the wireless communication device is a quadrature device and the means for mixing comprises first end second portions for mixing the RF input and first and second quadrature LO inputs, the apparatus further comprising a phase splitter coupled to the oscillator means output to generate first and second quadrature LO signals for the first and second quadrature LO inputs, respectively.

26. The apparatus of claim 22 wherein the first counter of the plurality of counter stages has a count length greater than a count length of any of the other ones of the plurality of counter stages.

27. The apparatus of claim 22 wherein the first counter of the plurality of counter stages counts down from a preprogrammed count value to one and, upon reaching one, the plurality of programmable counter stages being reprogrammed using the programmable counter inputs.

28. A method for frequency generation comprising:
supplying a clock signal to a programmable modulus counter whose count modulus, configurable to an integer or a fractional value, is determined by a plurality of control inputs;
programing each of a plurality of counter stages with a respective count value; and
supplying an output signal from the modulus counter to the plurality of counter stages wherein the programming of the plurality of counter stages is based on a count value of a first counter of the plurality of counter stages and the control inputs for the modulus counter are based on count values of respective ones of the remaining ones of the plurality of counter stages.

29. The method of claim 28 wherein programming of the plurality of counter stages occurs when the count value of the first counter is one.

30. The method of claim 28 wherein the control inputs each have a first logic level while a respective counter is in a non-zero state and a second logic level while the respective counter is in a zero state.

31. The method of claim 28 wherein the modulus counter and plurality of counter stages form a portion of a phase-locked loop, the method further comprising:
generating an output signal whose frequency is dependent on an input control signal, the output signal being provided as the clock signal to the programmable modulus counter;
generating a reference signal;
comparing the phase of the reference signal and an output of the first counter stage; and
generating an oscillator control signal based on the phase comparison.

32. The method of claim 31 for use in a wireless communication device having a radio frequency (RF) circuit portion, the method further comprising mixing an RF signal and a local oscillator (LO) signal wherein the output signal whose frequency is dependent on the input control signal is the LO signal.

33. The method of claim 32 wherein the wireless communication device is a quadrature device and the mixing comprises mixing the RF signal and first and second quadrature LO signals, the method further comprising phase splitting the output signal whose frequency is dependent on the input control signal to thereby first and second quadrature LO signals.

34. The method of claim 28 wherein the first counter of the plurality of counter stages has a count length greater than a count length of any of the other ones of the plurality of counter stages.

35. The method of claim 28 wherein the first counter of the plurality of counter stages counts down from a preprogrammed count value to one and, upon reaching one, the plurality of programmable counter stages being reprogrammed using the programmable counter inputs.

36. A programmable high speed counter apparatus, comprising:
a prescaler having a prescaler clock input, first and second control inputs, and a prescaler output clock having a quad-modulus counter with a divide ratio determined by the first and second control inputs; and
first, second and third programmable counters each having programmable counter inputs to receive data indicative of a respective count value and a clock input coupled to the prescaler output clock, the first control input having a first logic level while the second counter is in a non-zero state and the second control input having the first logic level while the third counter is in a non-zero state;
wherein the divide ratio of the quad modulus counter generates divide ratios having the following relationship: $P$, $P+1$, $P+\sqrt{P}$, and $P+\sqrt{P}+1$ depending on the logic state of the first and second control inputs.

37. The apparatus of claim 36, wherein the divide ratio P is selected to have a value that is a power of four.

* * * * *